(12) United States Patent
Wall et al.

(10) Patent No.: US 12,034,235 B2
(45) Date of Patent: *Jul. 9, 2024

(54) ANTENNA DYNAMICALLY MATCHED WITH ELECTROMECHANICAL RESONATORS

(71) Applicant: HRL Laboratories, LLC, Malibu, CA (US)

(72) Inventors: Walter S. Wall, Santa Monica, CA (US); Randall L. Kubena, Oak Park, CA (US); Harris P. Moyer, Los Angeles, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 245 days.

This patent is subject to a terminal disclaimer.

(21) Appl. No.: 17/530,303

(22) Filed: Nov. 18, 2021

(65) Prior Publication Data

US 2022/0077588 A1     Mar. 10, 2022

Related U.S. Application Data

(60) Division of application No. 15/942,435, filed on Mar. 31, 2018, now Pat. No. 11,211,711, which is a
(Continued)

(51) Int. Cl.
*H01Q 9/14*      (2006.01)
*H01Q 1/22*      (2006.01)
(Continued)

(52) U.S. Cl.
CPC ............... *H01Q 9/14* (2013.01); *H01Q 1/22* (2013.01); *H03H 7/38* (2013.01); *H03H 9/0004* (2013.01)

(58) Field of Classification Search
CPC .... H01Q 9/14; H01Q 1/22; H03H 7/38; H03H 9/0004
See application file for complete search history.

(56) References Cited

U.S. PATENT DOCUMENTS 3,445,849 A    5/1969   Sanford
4,501,018 A    2/1985   Shanley
(Continued)

FOREIGN PATENT DOCUMENTS

CN          1640084      7/2005
CN         101151766      3/2008
(Continued)

OTHER PUBLICATIONS

U.S. Appl. No. 17/459,891, filed Aug. 27, 2021, Wall.
(Continued)

*Primary Examiner* — Seung H Lee
(74) *Attorney, Agent, or Firm* — Ladas & Parry, LLP

(57) ABSTRACT

A RF transmitting device and method for transmitting digital information wherein the device is connected to or connectable with an antenna, the RF transmitting device having an RF source or transmitter, an electronic switch, a plurality electromechanical resonators each connected to the electronic switch. The electronic switch connects a selected one or selected ones of the electromechanical resonators between the RF source or transmitter and the antenna. Alternatively, the electronic switch connects a selected one or selected ones of the electromechanical resonators between different portions of the antenna. The electronic switch is controlled by a digital control unit for causing the electronic switch to couple RF energy produced by the RF source or transmitter to the antenna via the selected one or selected ones of the plurality of electromechanical resonators.

7 Claims, 7 Drawing Sheets

Related U.S. Application Data continuation-in-part of application No. 15/638,052, filed on Jun. 29, 2017, now Pat. No. 11,145,982.

(60) Provisional application No. 62/356,734, filed on Jun. 30, 2016.

(51) Int. Cl.
*H03H 7/38* (2006.01)
*H03H 9/00* (2006.01)

(56) References Cited

U.S. PATENT DOCUMENTS

| | | |
|---|---|---|
| 5,489,914 A | 2/1996 | Breed |
| 5,705,879 A | 1/1998 | Abe |
| 5,801,661 A | 9/1998 | Suzuki |
| 7,154,938 B2 * | 12/2006 | Cumeralto ............ H04L 27/32 375/150 |
| 7,486,002 B2 | 2/2009 | Pulskamp |
| 7,573,350 B2 | 8/2009 | Frank |
| 7,738,840 B2 * | 6/2010 | Rofougaran ............ H04B 1/48 455/78 |
| 8,125,399 B2 | 2/2012 | McKinzie |
| 8,958,766 B2 | 2/2015 | Ungan |
| 9,054,798 B2 | 6/2015 | Xu |
| 9,362,619 B2 | 6/2016 | Montgomery |
| 9,368,869 B2 | 6/2016 | Chen |
| 9,413,065 B2 | 8/2016 | Caimi |
| 9,444,139 B2 | 9/2016 | Montgomery |
| 9,478,856 B2 | 10/2016 | Marshall |
| 9,496,609 B2 | 11/2016 | Marshall |
| 9,627,753 B2 | 4/2017 | Caimi |
| 9,680,220 B2 | 6/2017 | Rabe |
| 9,692,124 B2 | 6/2017 | Caimi |
| 9,912,319 B2 | 3/2018 | Nakai |
| 10,096,910 B2 | 10/2018 | Chen |
| 10,212,657 B2 | 2/2019 | Wiser |
| 10,727,570 B2 | 7/2020 | Paulotto |
| 10,819,313 B2 | 10/2020 | Voutilainen |
| 11,145,982 B2 | 10/2021 | Wall |
| 11,165,139 B1 | 11/2021 | Paulotto |
| 11,211,711 B2 | 12/2021 | Wall |
| 2004/0135675 A1 | 7/2004 | Thiesen |
| 2004/0227585 A1 | 11/2004 | Taniguchi |
| 2004/0227586 A1 | 11/2004 | Taniguchi |
| 2005/0174192 A1 | 8/2005 | Kawamura |
| 2008/0042819 A1 | 2/2008 | Masudaya |
| 2008/0197943 A1 | 8/2008 | Xu |
| 2008/0224568 A1 | 9/2008 | Kvisteroy |
| 2010/0291946 A1 | 11/2010 | Yamakawa |
| 2011/0090026 A1 | 4/2011 | Nakahashi |
| 2012/0126913 A1 | 5/2012 | Hara |
| 2012/0182092 A1 | 7/2012 | Yokoyama |
| 2012/0229307 A1 * | 9/2012 | Tsai ............ G06F 3/0231 375/300 |
| 2013/0130631 A1 | 5/2013 | Song |
| 2013/0130636 A1 | 5/2013 | Ungan |
| 2013/0321093 A1 | 12/2013 | Ueda |
| 2013/0335280 A1 | 12/2013 | Chen |
| 2015/0002355 A1 | 1/2015 | Yan |
| 2015/0116153 A1 | 4/2015 | Chen |
| 2015/0116159 A1 | 4/2015 | Chen |
| 2015/0116161 A1 | 4/2015 | Caimi |
| 2015/0116162 A1 | 4/2015 | Caimi |
| 2015/0116163 A1 | 4/2015 | Caimi |
| 2015/0116170 A1 | 4/2015 | Caimi |
| 2015/0117219 A1 | 4/2015 | Marshall |
| 2015/0117334 A1 | 4/2015 | Rabe |
| 2015/0117358 A1 | 4/2015 | Marshall |
| 2015/0117415 A1 | 4/2015 | Rabe |
| 2015/0117502 A1 | 4/2015 | Chen |
| 2015/0117560 A1 | 4/2015 | Caimi |
| 2015/0118972 A1 | 4/2015 | Marshall |
| 2015/0118973 A1 | 4/2015 | Montgomery |
| 2015/0118974 A1 | 4/2015 | Montgomery |
| 2015/0119045 A1 | 4/2015 | Montgomery |
| 2015/0119052 A1 | 4/2015 | Caimi |
| 2015/0120189 A1 | 4/2015 | Giometti |
| 2015/0137908 A1 | 5/2015 | Nishihara |
| 2015/0333401 A1 | 11/2015 | Maruthamuthu |
| 2016/0191014 A1 | 6/2016 | Khlat |
| 2016/0248155 A1 | 8/2016 | Montgomery |
| 2016/0352310 A1 | 12/2016 | Tani |
| 2017/0040670 A1 | 2/2017 | Chen |
| 2017/0054431 A1 | 2/2017 | Shimomura |
| 2017/0099041 A1 | 4/2017 | Wall |
| 2018/0198211 A1 | 7/2018 | Wall |
| 2018/0226720 A1 | 8/2018 | Wall |
| 2020/0136234 A1 | 4/2020 | Paulotto |
| 2021/0328327 A1 | 10/2021 | Paulotto |

FOREIGN PATENT DOCUMENTS

| | | |
|---|---|---|
| CN | 101304120 | 11/2008 |
| CN | 102576937 A | 7/2012 |
| CN | 104471864 | 3/2015 |
| CN | 105897280 | 8/2016 |
| CN | 106711581 | 5/2017 |
| DE | 2836608 | 3/1980 |
| EP | 2819242 | 12/2014 |
| EP | 3649739 | 5/2020 |
| JP | S60 85603 | 5/1985 |
| JP | 2005-260382 | 9/2005 |
| JP | 2011-128956 | 6/2011 |
| KR | 10-2005-0048164 | 5/2005 |
| WO | 03/077489 | 9/2003 |
| WO | 2015/095573 | 6/2015 |
| WO | 2016/081894 | 5/2016 |
| WO | 2019/005251 | 1/2019 |

OTHER PUBLICATIONS

U.S. Appl. No. 17/459,891, filed Aug. 27, 2021 (non-publication requested), Wall, et al.
Office action from Chinese Patent Application No. 201880039305.X dated Jul. 4, 2022 with its English translation and search report.
Office action from Chinese Patent Application No. 201880039305.X dated Nov. 25, 2021, and its brief English translation.
Office action from European Patent Application No. 18822769.8 dated Apr. 4, 2022.
From U.S. Appl. No. 15/942,435 (now published as U.S. Pat. No. 11,211,711), Notice of Allowance mailed on Sep. 14, 2021.
From U.S. Appl. No. 15/942,435 (now published as U.S. Pat. No. 11,211,711), Notice of Allowance mailed on Aug. 31, 2021.
From U.S. Appl. No. 15/942,435 (now U.S. Pat. No. 11,211,711), Notice of Allowance mailed Aug. 19, 2021.
From U.S. Appl. No. 15/942,435 (now U.S. Pat. No. 11,211,711), Office Action mailed on Mar. 31. 2021.
From U.S. Appl. No. 15/942,435 (now U.S. Pat. No. 11,211,711), Office Action mailed on Jul. 9, 2020.
From U.S. Appl. No. 15/638,052 (now published as U.S. Pat. No. 11,145,982), Notice of Allowance mailed on Jun. 24, 2021.
From U.S. Appl. No. 15/638,052 (now published as U.S. Pat. No. 11,145,982), Notice of Allowance mailed on Jun. 14, 2021.
From U.S. Appl. No. 15/638,052 (now published as U.S. Pat. No. 11,145,982), Office Action dated Mar. 2, 2021.
From U.S. Appl. No. 15/638,052 (now published as U.S. Pat. No. 11,145,982), Office Action dated Jul. 24, 2020.
From U.S. Appl. No. 15/638,052 (now published as U.S. Pat. No. 11,145,982), Office Action dated Jan. 23, 2020.
From U.S. Appl. No. 15/638,052 (now published as U.S. Pat. No. 11,145,982), Office Action dated Jul. 5, 2019.
From U.S. Appl. No. 15/638,052 (now published as U.S. Pat. No. 11,145,982), Office Action dated Apr. 5, 2019.
PCT International Preliminary Report on Patentability (Chapter I) with Written Opinion from PCT/US2018/025596 dated Jan. 9, 2020.
PCT International Preliminary Report on Patentability (Chapter I) with Written Opinion from PCT/US2018/025595 dated Jan. 9, 2020.

(56) References Cited

OTHER PUBLICATIONS

PCT International Search Report and Written Opinion from PCT/US2018/025596 dated Jul. 17, 2018.
PCT International Search Report and Written Opinion from PCT/US2018/025595 dated Jul. 26, 2018.
Extended European Search Report from EPO Patent Application No. 18822769.8 dated Feb. 24, 2021.
Extended European Search Report from EPO Patent Application No. 18825364.5 dated Nov. 13, 2020.
Office action from Chinese Patent Application No. 201880040832.2 dated Mar. 4, 2021 with search report, and its English translation.
Office action from Chinese Patent Application No. 201880040832.2 dated Jul. 30, 2021 and brief English summary.
Hansen, R. C. "Efficiency and Matching Tradeoffs for Inductively Loaded Short Antennas", IEEE Transactions on Communications, vol. Com-23, No. 4, Apr. 1975, pp. 430-435.
Nimo, Antwi et al., "A New Family of Passive Wireless RF Harvesters based on R-C-Quartz Oscillators", Proceedings of the 43rd European Microwave Conference, Oct. 2013, pp. 511-514.
Sussman-Fort, Stephen E., et al. "Non-Foster Impedance Matching of Electrically-Small Antenna", IEEE Transactions on Antennas and Propagation, vol. 57, No. 8, Aug. 2009, pp. 2230-2241.
Office action from European Patent Application No. 18825364.5 dated Nov. 9, 2022.
From U.S. Appl. No. 17/459,891 (non-publication request filed), Office Action mailed on Oct. 20, 2023.

\* cited by examiner

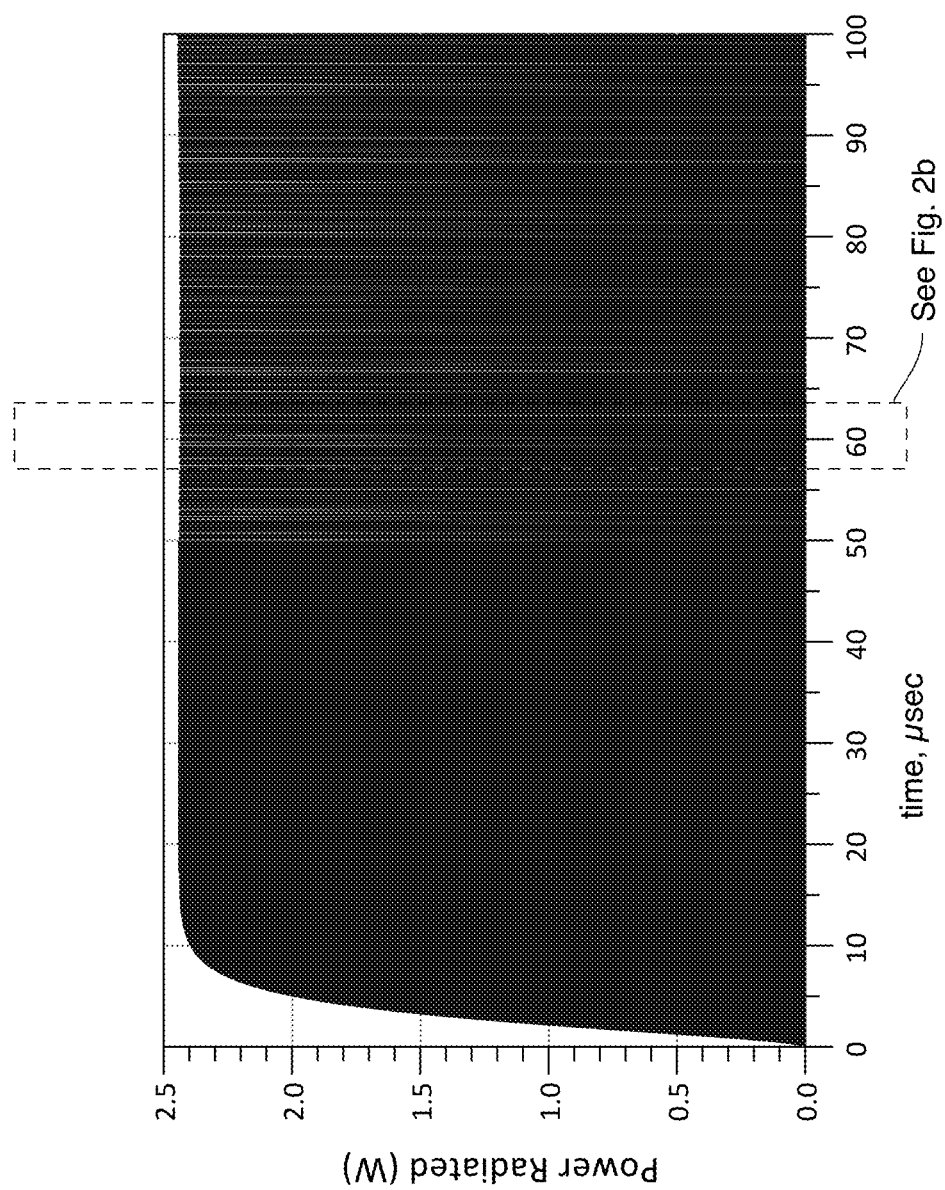

ANTENNA DYNAMICALLY MATCHED WITH ELECTROMECHANICAL RESONATORS

CROSS REFERENCE TO RELATED APPLICATIONS

This application is a Division of U.S. patent application Ser. No. 15/942,435, filed on Mar. 31, 2018 and entitled "Antenna Loaded with Electromechanical Resonators", which application is a Continuation-in-Part of U.S. patent application Ser. No. 15/638,052 filed on Jun. 29, 2017 and also entitled "Antenna Loaded with Electromechanical Resonators", the disclosures of which are hereby incorporated herein by reference. Each of these applications also claims the benefit of U.S. Provisional Patent Application Ser. No. 62/356,734 filed on Jun. 30, 2016 and entitled "Antenna Loaded with Electromechanical Resonators", the disclosure of which is also hereby incorporated herein by reference.

STATEMENT REGARDING FEDERALLY SPONSORED RESEARCH OR DEVELOPMENT

None

TECHNICAL FIELD

This invention relates to using electromechanical resonators with antennas. The resonators are switched into a series connection with all or a portion of the antennas dynamically.

BACKGROUND

Many locations, such as dense urban areas, forests, and underwater environments present significant challenges for the reception and transmission of wireless signals. Radio frequency system operating below 30 MHz are more efficient at penetrating these difficult environments but the systems required to generate and receive these waves are often large, heavy, and inefficient, making them impractical for many small and/or mobile platforms. In the above-identified US Patent Application, it is taught that the efficiency of electrically small dipole and monopole antennas can be dramatically improved using matching networks comprised of high Q electromechanical resonators. These resonators improve the efficiency of traditional small antenna matching techniques by generating inductive reactance values with significantly less loss or higher Q than traditional coil inductors. However, increasing the Q associated with antenna matching networks also reduces the antenna bandwidth and thus limits the amount of information which can be transmitted from the antenna.

So there is a need to further improve upon the technology of above-identified US Patent Application to increase the bandwidth of antenna (and particularly electrically small antennas), especially those using matching networks comprised of high Q electromechanical resonators. As is discussed below, while the present invention maybe conveniently utilized with electrically small antennas, it is not limited to electrically small antennas, but rather may be used with larger antenna, more full sized (or completely full sized) antennas, if desired.

BRIEF DESCRIPTION OF THE INVENTION

This invention is to improves upon the bandwidth limitations associated with antenna, and particularly Electrically Small Antennas (ESAs). In the technology described in the above-identified US Patent Application by dynamically switching the electromechanical resonators used to match electrically small monopole and dipole antennas to enable high data rate On-Off Keying (OOK) and Frequency Shift Keying (FSK) transmission schemes. As is discussed below, the present invention may be used with larger antennas than ESA antennas if desired.

In a very basic embodiment, this invention comprises a dipole or monopole antenna (for example), matched to a continuous wave (CW) transmitter through a single electromechanical resonator. Connecting this resonator to the aforementioned antenna is a single pole double throw (SPDT) switch, where one of the outputs of this switch is connected to the input of the antenna and the second output of the switch is connected a capacitor preferably having the same reactance as the antenna. By operating this switch to toggle between the antenna and the capacitor, a high data-rate OOK waveforms can be radiated.

In another embodiment, this invention comprises a dipole or monopole antenna matched to a frequency modulated (FM) transmitter through a bank of electromechanical resonators. The FM transmitter preferably outputs a CW signal (at any given instance of time) whose CW (or carrier) frequency is modulated in a step-wise fashion. Each resonator in this bank serves to match the antenna to a different frequency output by the FM transmitter. By using a single pole multiple throw (SPMT) switch=, for example, connected to these electromechanical resonators, the impedance match frequency of the antenna can be synchronously switched with the output frequency of the transmitter, enabling high data-rate FSK waveforms to be radiated. The frequency shift keying may comprise just two tones as in traditional FSK signal or it may comprise a multiple tone frequency hopping spread spectrum signal. The number of the electromechanical resonators utilized will typically equal the number of different tones which can be transmitted. Only one tone is generated at any instant of time. This network of electromechanical resonators and switches can be placed at the feed end of the antenna or anywhere along the length of a monopole antenna or anywhere along at least one arm of dipole antenna.

A novel feature of this invention is a monopole or dipole antenna dynamically matched to a transmitter using electromechanical resonators, thus enabling high efficiency and high bandwidth signals to be radiated from the antenna.

The present invention provides a method of transmitting an RF signal from an antenna comprising, the method comprising: generating single tone signals one at a time by RF source or transmitter capable of generating a plurality of single tone signals, and coupling an output of the RF source or transmitter to the electrically short antenna via a selected one of a plurality of resonators, the selected one of the plurality of resonators being selected according to a trigger signal which also selects the single tone generated by the RF source or transmitter.

The single tone signals referred to tin the preceding paragraph may also comprise multiple tones signals which are close enough to each other frequency-wise so that they fall within an acceptable bandwidth of the aforementioned selected one of the plurality of resonators.

BRIEF DESCRIPTION OF THE DRAWINGS

FIGS. 2a and 2b are plots of simulated radiated power from a 12" dipole antenna configured using the dynamic matching network shown in FIG. 1 as is described below. FIG. 2b shows a portion of the plot of FIG. 2a, and is representative of what the entire plot of FIG. 2a would look like (except that the power would be lower at the beginning of FIG. 2a) if FIG. 2a could be presented as a much larger figure.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Figure 1:
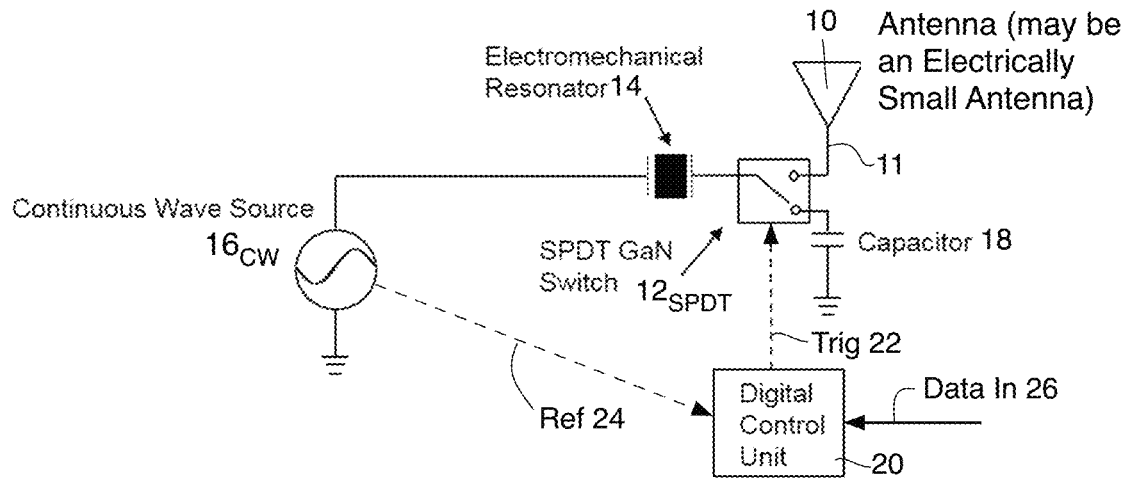
FIG. 1. illustrates one embodiment of the present invention, which uses a single electromechanical resonator to dynamically match a dipole or monopole antenna to generate broadband OOK signals; the electrical properties of the electromechanical resonator can be modeled as a series inductor, capacitor, and resistor, in parallel with a capacitor as is depicted by the equivalent circuit diagram of FIG. 1-1.
Figure 1:
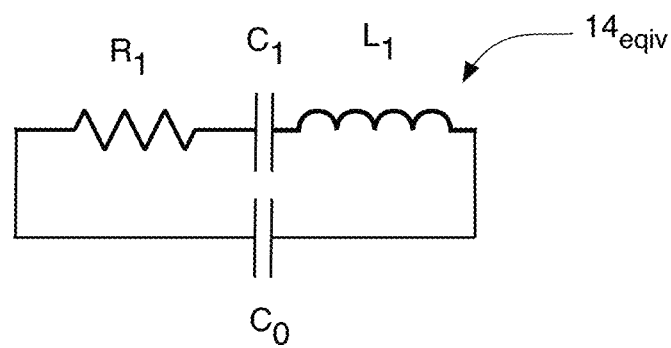

One embodiment of the present invention is now described with reference to FIG. 1. In FIG. 1 a dipole or monopole antenna 10 is connected via a conductor 11 to one output of a single pole double throw (SPDT) switch $12_{SPDT}$ whose input is connected to an electromechanical resonator 14 which, in turn, is connected to a continuous wave (CW) source or transmitter $16_{CW}$. The other output of the switch 12 is connected to a capacitor 18 preferably having the same reactance as the antenna 10. The conductor 11 may be a coaxial cable with a grounded shield or a pair of parallel conductors commonly found in transmission circuits. In some embodiments a balun (not shown) may be utilized between the antenna 10 and conductor 11. Control signals (see numeral 22) for the switch 12 are supplied by a control unit 20, which is synchronized via other control signals (see numeral 24) with the phase of the source or transmitter 16 to ensure that switching of switch 12 only occurs at a current minimum of the source or transmitter 16. By operating the switch 12 to toggle between the antenna 10 and capacitor 18, high data-rate on-off keying (OOK) waveforms can be radiated by antenna 10. The digital control unit 20 is described in greater detail below.

The electromechanical resonator 14 is preferably constructed as a MEMS resonator which can be formed from a variety of different materials, such as, but not limited, to Quartz, Si, and $LiNbO_3$, and can be designed by persons skilled in the technology of such devices to operate in a variety of different modes depending on the desired frequency of operation. At UHF-VHF frequencies, a quartz resonator can be constructed to operate in a shear mode, whereas at HF and MF frequencies it can be constructed to operate in an extensional mode, and at VLF and LF frequencies it can be constructed to operate as a tuning fork resonator. The electrical properties of the resonator 14 can be modeled as a series inductor, capacitor, and resistor, in parallel with a capacitor as is depicted in the equivalent circuit 14 of FIG. 1-1. This equivalent circuit 14, also known as the Butterworth-Van Dyke (BVD) model, has both a series and parallel resonance. The highest resonator inductance values lie between the series and parallel resonances of the resonator and therefore it is within this range that the best matching occurs.

The SPDT switch 12 may be implemented by a semiconductor transistor, such as a GaN transistor, although other transistor types and/or chemistries may alternatively be used if desired. Also, the switch 12 may comprise more than one transistor.

To demonstrate the effect of the present dynamic electromechanical antenna matching technique, a simulation of a 32 MHz sheer mode resonator was performed in COMSOL. In this simulation a 4W source operating at 31.9 MHz was used to excite a dipole antenna 10. The switch 12 shown in FIG. 1 was operated with a 0.01 ns rise and fall time, a 0.333 s period, and 50% duty cycle.

The parameters of a Butterworth-Van Dyke (BVD) model of an equivalent circuit $14_{equiv}$ (shown in FIG. 1-1) of the electromechanical resonator 14 of FIG. 1 for this simulation are given in Table I below:

TABLE I

| Parameter | Value |
|---|---|
| $C_o$ | 0.8 pF |
| $C_1$ | 5 fF |
| $L_1$ | 5 mH |
| $R_1$ | 3 Ω |

Figure 2B:
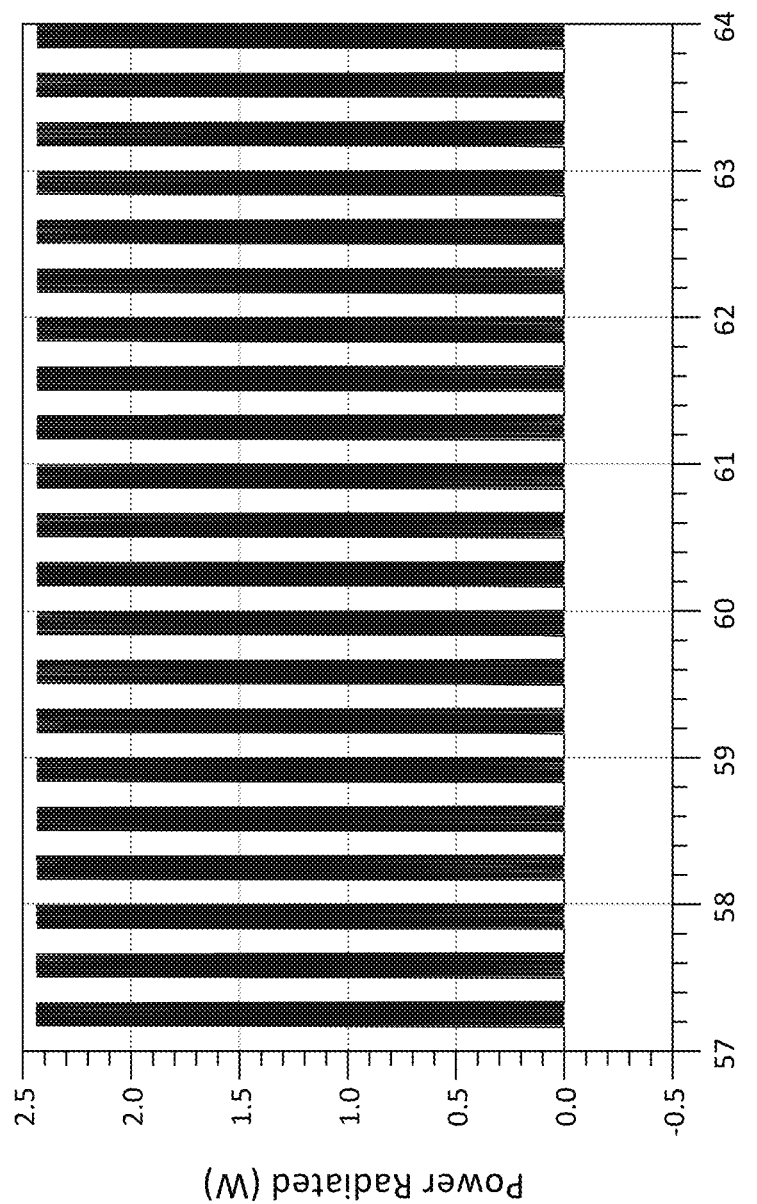

Around 31.9 MHz this resonator 14 exhibits an inductance of 31.5 H along with a large quality factor (Q) of 520. This quality factor is approximately ten times greater than a Commercial Off The Shelf (COTS) chip inductor, thus increasing the radiation efficiency of an electrically small antenna by about 10 dB, but bandwidth of that same antenna would also be decreased by a factor of 10. However by periodically switching the output of the electromechanical resonator between the antenna 10 and a load capacitor 18, waveforms with significantly broader bandwidths can be radiated. To demonstrate this, transient simulations of a 12" dipole antenna (having a driven element with 6 inch arms) matched with the equivalent inductance extracted from the aforementioned 31.9 MHz shear mode resonator 14, were performed using a commercial circuit simulation software. A full size ¼ wave dipole antenna resonant at 32 MHz would have elements approximately 7 feet long (14 ft for the dipole end to end) and if that is compared to the 6 inch elements utilized in this simulation, the dipole antenna 10 is certainly an Electrically Short Antenna (ESA). The nominal bandwidth of this electrically short dipole antenna 10 matched without a matching resonator 14 would be approximately 93 KHz. However, by utilizing an embodiment of dynamic antenna matching configuration shown in FIG. 1, the output radiation of the same antenna can be modulated at a rate of 3 MHz (see FIGS. 2a and 2b). FIGS. 2a and 2b are plots of simulated radiated power from a 12" dipole antenna configured using the dynamic matching network shown in FIG. 1 as is described above. FIG. 2b shows a portion of the plot of FIG. 2a, and is representative of what the entire plot of FIG. 2a would look like (except that the power would be lower at the beginning of FIG. 2a) if FIG. 2a could be presented as a much larger figure.

Figure 3:
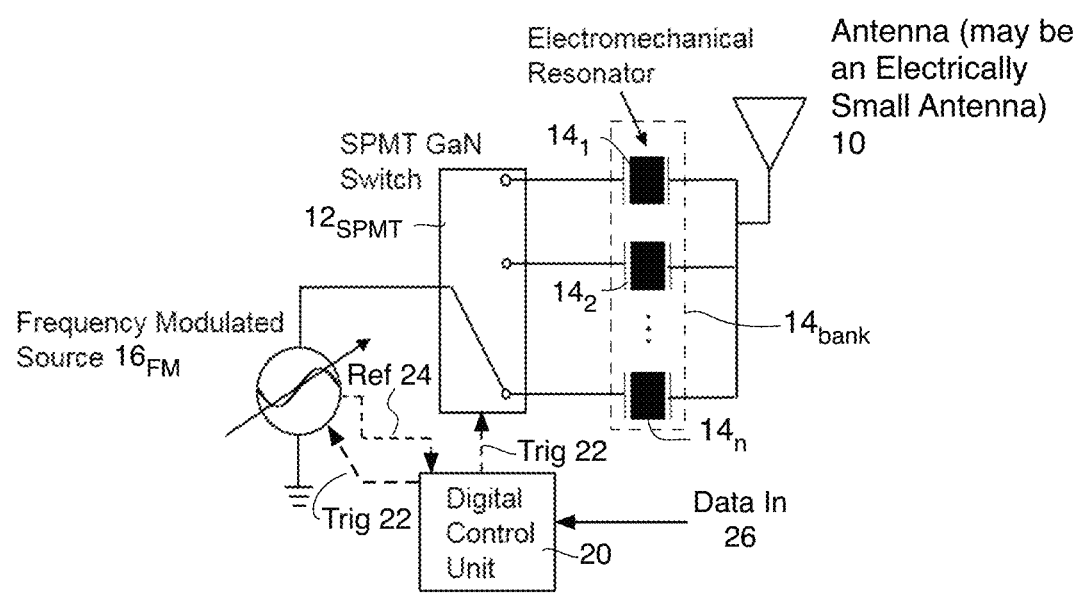
FIG. 3 illustrates another embodiment of the present invention, which uses a bank of electromechanical resonator to dynamically match a dipole or monopole antenna to generate broadband FSK signals or broadband spread spectrum signals.

Another embodiment of the present invention is now described with reference to FIG. 3. In this embodiment, the dipole or monopole antenna 10 (which may be—but need not be—an ESA) is connected in series to a bank $14_{bank}$ of electromechanical resonators $14_1 \ldots 14_n$ and a single pole multiple throw (SPMT) switch $12_{SPMT}$ as well as a frequency modulated (FM) source or transmitter $16_{FM}$. The FM source or transmitter $16_{FM}$ preferably outputs a CW (or carrier) signal (at any given instance of time) whose frequency is modulated in a step-wise fashion in sync with the switching the electromechanical resonators $14_1 \ldots 14_n$ in or out of connection between the FM source or transmitter $16_{FM}$ and the antenna 10, which switching is controlled by trigger or synchronizing signals (Trig) on signal line 22 to select one of the resonators $14_1 \ldots 14_n$ to connect the source or transmitter $16_{FM}$ to the antenna 10. Each resonator $14_1 \ldots 14_n$ in the bank $14_{bank}$ serves to match the antenna 10 to a different CW frequency output by FM source or transmitter $16_{FM}$. When matched to the antenna 10, the selected resonator (among the group of resonators in the bank $14_{bank}$) which is switched into series connection between the source or transmitter $16_{FM}$ and the antenna has, at the frequency being transmitted, a high Q, and preferably a Q greater than 500 at the frequency being transmitted. The trigger or synchronizing signals on signal line 22 for switch $12_{SPMT}$ are supplied by a slightly more complex version of external control unit 20 of FIG. 1, which is synchronized a priori via a reference signal (Ref) on line 24 which provides the phase and frequency of the frequency modulated source or transmitter $16_{FM}$ to help ensure that trigger or synchronizing signals (Trig) on signal line 22 occur at transmit RF current minimums. Using the embodiment of control unit 20 of FIG. 3, resonators $14_1 \ldots 14_1$ in this matching network are synchronously switched to match the output frequency of the source or transmitter $16_{FM}$ to antenna 10 at points in time when the current through the selected resonator in the bank of electromechanical resonator $14_1 \ldots 14_n$ is at a minimum. This time varying antenna matching scheme enables high data-rate FSK waveforms to be radiated. In the embodiment of FIG. 3, the bank of resonators $14_1 \ldots 14_n$ and a bank of GaN switches implementing $12_{SPMT}$ are preferably located at or near the base of the monopole or dipole antenna 10, although they can also be placed anywhere along the length of the arms of the dipole antenna (see FIGS. 4 and 5) with the understanding that this will change the resonant frequency and radiation resistance of the antenna 10.

Some FSK signals involve only two transmitted frequencies (two tones). In the case of a 2-tone FSK signal having two different transmit frequencies, then n=2 and only two different electromechanical resonator 141 and 142 are needed. If the FSK signal involves additional tones (as in the case of spread spectrum signals), then the number of different frequencies transmitted by FM source or transmitter $16_{FM}$ (n frequencies, with each frequency occurring in a different time slot) and the number (n) of the electromechanical resonators $14_1 \ldots 14_n$ will be greater than 2 (and perhaps substantially greater than 2).

Moreover, if the FM source or transmitter $16_{FM}$ is intended to operate in different frequencies bands and/or on multiple pairs of tones (and/or on multiple groups of n-tones for spread spectrum operation), then the total number n of resonators $14_1 \ldots 14_n$ in the bank $14_{bank}$ of resonators may be very large (in the hundreds or even thousands).

Since the resonators $14_1 \ldots 14_n$ are preferably embodied as MEMS devices, a large number can be placed in a transmitter, even if the transmitter is embodied a handheld device. Additionally, the antenna 10 may be physically fixed to or with such a handheld device or it may be removable, as may be desired.

If the tones are sufficiently closely spaced from one another, then in some embodiments, a single resonator in the resonator bank may be utilized for more than one tone, so in that case the number of resonators may be less that the number of transmitted tones.

Figure 4:
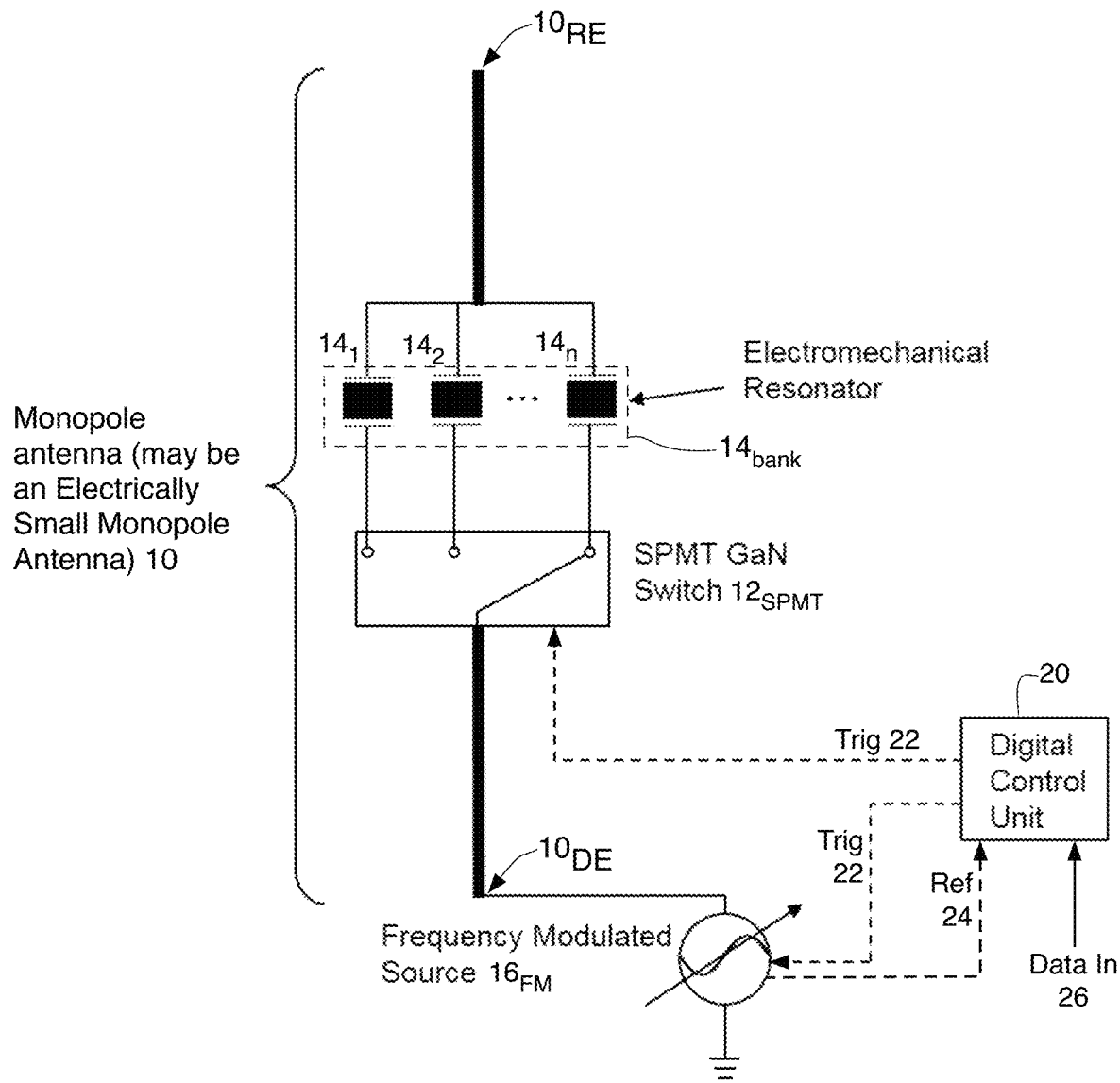
FIG. 4 illustrates a third embodiment of the present invention, in which a bank of electromechanical resonators is used to dynamically center load a monopole antenna.
Figure 5:
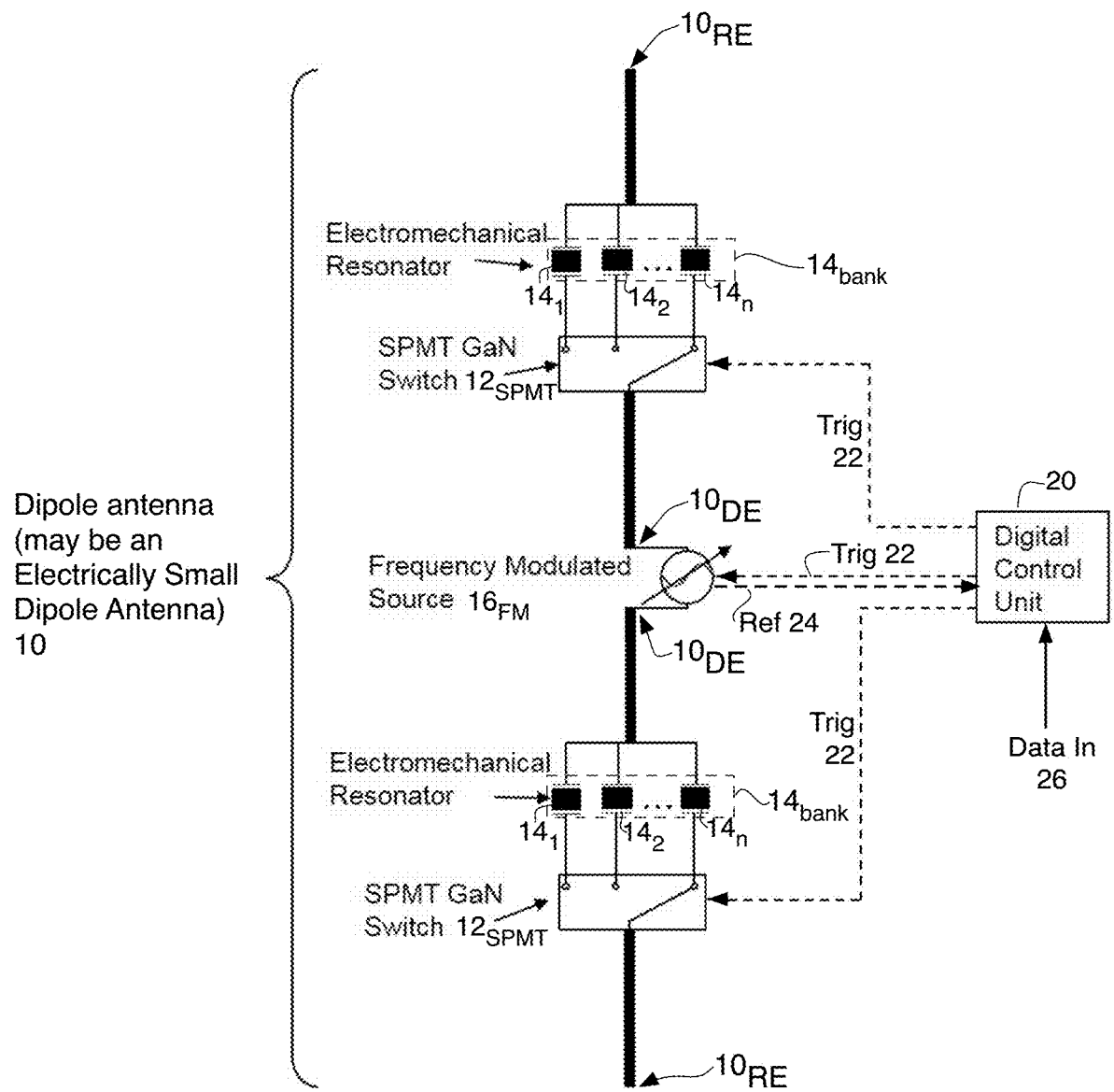
FIG. 5 illustrates a fourth embodiment of the present invention, in which a bank of electromechanical resonators are used to dynamically center load both arms of a dipole antenna.

FIG. 4 illustrates an embodiment of the present invention, which is similar to the embodiment of FIG. 3, but in which the bank $14_{bank}$ of electromechanical resonators is used to dynamically center load a monopole antenna 10 (which may optionally be electrically small). FIG. 5 illustrates another embodiment of the present invention, which is similar to the embodiments of FIGS. 3 and 4, but in which a bank $14_{bank}$ of electromechanical resonators is used to dynamically center load each arm of an dipole antenna 10 (which also may optionally be electrically small). The embodiments of FIGS. 4 and 5 are otherwise operationally identical to the embodiment of FIG. 3 (it being understood that the Qs of the individual electromechanical resonators are adjusted as needed to match the particular antennas 10 being utilized). While the bank $14_{bank}$ of electromechanical resonators in the embodiments of FIGS. 4 and 5 are preferably center loaded along the length of the transmitting elements of the antennas 10, the bank $14_{bank}$ of electromechanical resonators in some embodiments may be located other than at the centers of the transmitting elements of the antennas 10 and thus may, in such other embodiments, be located closer to (or at) either the driven end(s) $10_{DE}$ of antenna 10 or the remote end(s) $10_{RE}$ of antenna 10. Two signal lines 22 are depicted for these embodiments—both signal lines 22 convey the same information, but the Trig control signals on signal line 22 paralleling a portion of the antenna element(s) may be embodied as optical signals in these embodiments to avoid any undesirable electromagnetic coupling with the antenna 10 whereas the the Trig control signals on signal line 22 to source $16_{FM}$ may be embodied as electrical signals. Power to operate transistorized switch 16 may be sent to it optically as well. Moreover, in further embodiments, multiple banks $14_{bank}$ of electromechanical resonators (each with an associated switch 12) may be used between the driven end(s) $10_{DE}$ of antenna 10 or the remote end(s) $10_{RE}$ of antenna 10, if desired. And additionally a bank $14_{bank}$ of electromechanical resonators (with an associated switch 12) may be used between the driven end(s) $10_{DE}$ of antenna 10 and the FM source or transmitter $16_{FM}$ in such further embodiments.

The control unit 20 depicted in in FIGS. 1, 3, 4, and 5 takes an input a digital data stream 26 containing the information to be modulated on the RF signal to be transmitted. The origin the data in data stream 26 may be from a microprocessor or micro-controller or perhaps data memory. The data in stream 26 may be converted into an amplitude modulated voltage Trig signal on signal line 22 which, in the event, is preferably comprised of discrete voltage levels. In the case of the embodiment of FIG. 1, the Trig signal on signal line 22 switches between two voltage levels and serves as the input signal to the SPDT switch $12_{SPDT}$ for controlling that switch. The timing of the transition between these discrete voltage levels is synchronized with the reference signal (Ref) on line 24 from the RF source $16_{CW}$ to ensure that switching of the Trig signal on signal line 22 occurs when the RF current provided by source or transmitter 16 is at a minimum.

In the case of the frequency modulation embodiments shown in FIGS. 3, 4, and 5, the Trig signal on signal line 22 preferably comprises multiple voltage levels (or multiple optical intensity (or color) levels if optical signaling technologies are utilized) and serves as the input signal to the SPMT switches $12_{SPMT}$ shown in these figures. The timing of the transitions between these voltage or optical levels (or colors) is synchronized with the reference (Ref) signal on line 24 from the RF source to help ensure that switching occurs when the RF current provided by source or transmitter $16_{FM}$ is at (or near) a minimum to extend the live of the transistor switches therein. So the Trig signal on its signal line 22 to the source or transmitter tells the source or transmitter what RF frequency to transmit on while the signal Ref on line 24 from the source or transmitter $16_{FM}$ enables the switching to a different frequency (as instructed by the Trig signal on signal line 22) to occur at or near a RF current minimum. The switching to a different frequency occurs in sync with the switching in of a different resonator in bank $16_{bank}$.

Figure 6:
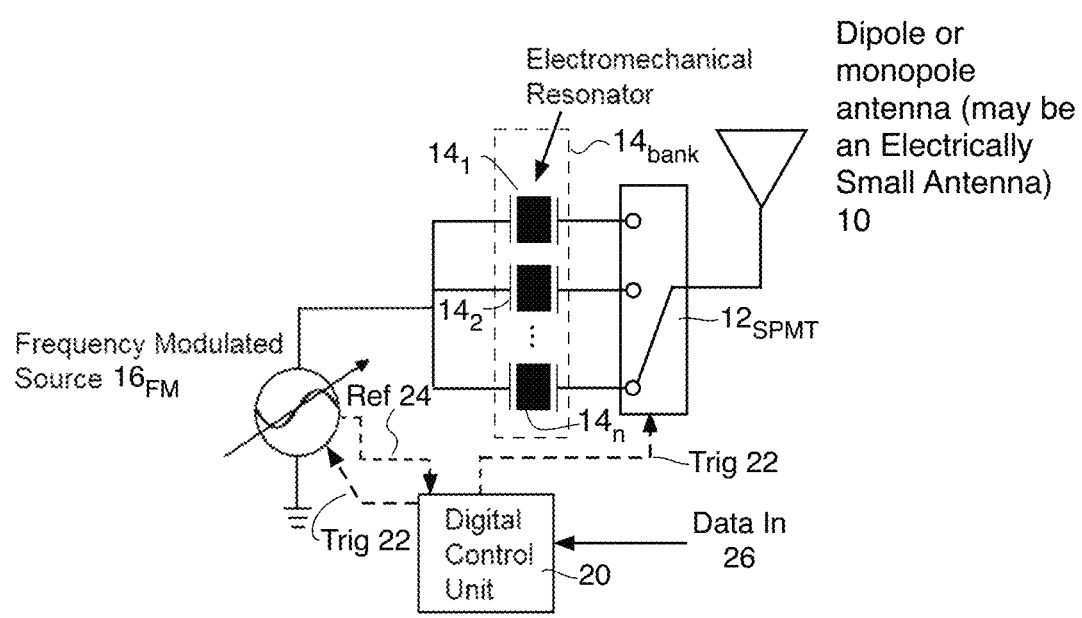
FIG. 6 illustrated an embodiment where the electronic switch is placed downstream of the bank of resonators from the RF source or transmitter.

FIG. 6 depicts an embodiment where the electronic switch 12 is placed downstream of the bank $16_{bank}$ of resonators instead of upstream (as in the case of the embodiment of FIG. 3). The resonators are preferably connected individually in series with the source 16 and the antenna 10, so the relative location of the switch 12 and the bank of resonators $14_{bank}$. The embodiments of FIGS. 4 and 5 may be similarly modified if desired.

It is certainly possible to envision more complicated switch 12 than the SPMT switch depicted in the embodiments of FIGS. 3-6. For example, multiple resonators could be connected in circuit between the source 16 and the antenna 10 at any instant of time, if desired, at the risk of complicating the design of switch 12. The depicted embodiments, where only one resonator 14 is coupled between the source 16 and the antenna 10 at any instant of time is preferred due to the relative simplicity of the design of switch 12, but the invention itself is not necessarily so limited, unless otherwise specifically required by the claims.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A RF transmitting device comprising:
    an RF source or transmitter,
    a single pole double throw (SPDT) switch having an input and first and second outputs, and
    a MEMS electromechanical resonator connected between the RF source or transmitter and said SPDT switch input,
    wherein said SPDT switch first output is connected to or connectable with an antenna, said SPDT switch second output is connected to or connectable with a device having an impedance, and the SPDT switch is controlled by a digital control unit configured for connecting the RF source or transmitter either to the antenna or to the device having an impedance.

2. The RF transmitting device of claim 1 wherein the digital control unit is responsive to RF energy produced by the RF source or transmitter and is configured to switch the SPDT switch causing RF energy produced by the RF source or transmitter to switch between the antenna and the device having an impedance at or near a RF current minimum.

3. The RF transmitting device of claim 1 wherein the digital control unit is configured to implement On-Off keying.

4. The RF transmitting device of claim 1 wherein the antenna is an electrically small dipole or monopole antenna and the device having an impedance is a capacitor.

5. The RF transmitting device of claim 1, wherein the SPDT switch and the MEMS electromechanical resonator are disposed between a driven end of an at least one transmitting element of the antenna and the RF source or transmitter.

6. An apparatus for transmitting an RF signal from an antenna comprising:
- a RF source or transmitter capable of generating a plurality of different signals one at a time,
- an antenna, the RF source or transmitter being coupled with the antenna via a selected one or ones of a plurality of resonators, and
- a digital control unit, wherein the selected one or ones of the plurality of resonators are configured to be selected according to a trigger signal generated by the digital control unit, and the trigger signal is configured for selecting a corresponding one of the different signals generated by the RF source or transmitter.

7. The apparatus of claim 6 wherein the plurality of resonators comprise a plurality of electromechanical MEMS resonators.

* * * * *